(12) United States Patent
Sharma et al.

(10) Patent No.: US 10,353,288 B2
(45) Date of Patent: Jul. 16, 2019

(54) LITHO-LITHO-ETCH DOUBLE PATTERNING METHOD

(71) Applicant: GLOBALFOUNDRIES INC., Grand Cayman (KY)

(72) Inventors: Vineet Sharma, Mechanicville, NY (US); Sohan S. Mehta, Saratoga Springs, NY (US); Craig D. Higgins, Altamont, NY (US); Sunil K. Singh, Mechanicville, NY (US); Feng Wang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/824,293

(22) Filed: Nov. 28, 2017

(65) Prior Publication Data

US 2019/0163054 A1    May 30, 2019

(51) Int. Cl.
| | | |
|---|---|---|
| *G03B 27/42* | (2006.01) | |
| *G03F 7/26* | (2006.01) | |
| *G03F 7/00* | (2006.01) | |
| *G03F 7/38* | (2006.01) | |

(52) U.S. Cl.
CPC .............. *G03F 7/0035* (2013.01); *G03F 7/38* (2013.01)

(58) Field of Classification Search
CPC ........ G03F 7/2024; G03F 7/2002; G03F 7/30; G03F 7/0392; G03F 7/0397; G03F 7/325; G03F 7/40; G03F 7/038; G03F 7/16
See application file for complete search history.

(56) References Cited

U.S. PATENT DOCUMENTS

| | | |
|---|---|---|
| 8,574,810 B2 | 11/2013 | Fonseca et al. |
| 2008/0187860 A1 | 8/2008 | Tsubaki et al. |
| 2011/0229832 A1* | 9/2011 | Kamimura ............ G03F 7/0392 430/325 |

* cited by examiner

*Primary Examiner* — Mesfin T Asfaw
(74) *Attorney, Agent, or Firm* — Anthony Canale; Hoffman Warnick LLC

(57) ABSTRACT

A litho-litho-etch double patterning method including forming a resist layer by coating a substrate with a resist composition; exposing the resist layer to a first radiant energy density of UV rays; forming a first pattern in the resist layer by developing the resist layer with a positive developer; exposing the resist layer to a second radiant energy density of UV rays; and forming a second pattern in the resist layer by developing the resist layer with a negative developer, the second pattern including one or more features of the first pattern.

17 Claims, 8 Drawing Sheets

US 10,353,288 B2

LITHO-LITHO-ETCH DOUBLE PATTERNING METHOD

TECHNICAL FIELD

The subject matter disclosed herein relates generally to double patterning methods for use in the process of producing a semiconductor device such as an integrated circuit (IC), and more particularly, to litho-litho-etch (LLE) double patterning methods.

BACKGROUND

Double patterning is a common multiple patterning technique in the semiconductor chip manufacturing industry. Multiple patterning enables chipmakers to image integrated circuit (IC) designs at 20 nanometers (nm) and below. Typically, double patterning refers to the litho-etch-litho-etch (LELE) pitch-splitting process, but double patterning also includes a spacer technique called self-aligned double patterning (SADP).

LELE requires two separate lithography and etch steps to define a single layer. LELE typically provides a 30% reduction in pitch, but LELE can be expensive, as it doubles the process steps in the lithography flow. Initially, this technique separates the layouts that cannot be printed with a single exposure, forming two lower-density masks. Then, it uses two separate exposure processes. This, in turn, forms two coarser patterns. They are combined and superimposed, which enables a single finer image on the wafer.

The SADP process uses one lithography step and additional deposition and etch steps to define a spacer-like feature. In the SADP process, the first step is to form mandrels on a substrate. Then, the pattern is covered with a deposition layer. The deposition layer is then etched, which, in turn, forms spacers. The top portion undergoes a chemical mechanical polishing (CMP) step, and the mandrels are removed, creating a mask using the remaining spacers. Only simple patterns are created in SADP or another version of the technology, self-aligned quadruple patterning (SAQP). In both SADP and SAQP, lone parallel lines are formed, followed by cuts.

Metal levels in DRAM and logic chips are more complex and cannot be created with SADP or SAQP. Instead, such metal layers are typically created by LELE. SADP and SAQP also have less design flexibility than LELE. Hole-type patterns are typically created by LELE-type technology as well. However, as noted above, LELE can be expensive since it doubles the process steps in the lithography flow. A less expensive, faster and simplified lithography flow is needed.

BRIEF SUMMARY

Double patterning methods for use in the process of producing a semiconductor device such as an integrated circuit are disclosed. In a first aspect of the disclosure, a double patterning method includes: forming a sole resist layer by coating a substrate with a resist composition wherein solubility of the resist composition in a positive developer increases upon irradiation with ultraviolet (UV) rays of a first radiant energy density and solubility of the resist composition in a negative developer decreases upon irradiation with UV rays of a second radiant energy density, the second radiant energy density of UV rays being greater than the first radiant energy density of UV rays; exposing the resist layer to the first radiant energy density of UV rays; forming a first pattern in the resist layer by developing the resist layer with the positive developer; exposing the resist layer to the second radiant energy density of UV rays; and forming a second pattern in the resist layer by developing the resist layer with the negative developer, the second pattern including one or more features of the first pattern.

In a second aspect of the disclosure, a double patterning method includes: forming a resist layer by coating a substrate with a resist composition wherein solubility of the resist composition in a positive developer increases upon irradiation with ultraviolet (UV) rays of a first radiant energy density and solubility of the resist composition in a negative developer decreases upon irradiation with UV rays of a second radiant energy density, the second radiant energy density of UV rays being greater than the first radiant energy density of UV rays; exposing the resist layer to the first radiant energy density of UV rays; forming a first pattern in the resist layer by developing the resist layer with the positive developer; exposing the resist layer to the second radiant energy density of UV rays; and forming a second pattern in the resist layer by developing the resist layer with the negative developer, the second pattern including one or more features of the first pattern; wherein the exposing of the resist layer to the first radiant energy density of UV rays generates an acid in an area substantially equal to an area of the resist layer exposed to the first radiant energy density of UV rays, wherein a concentration of the acid remaining in the resist layer after the developing of the resist layer with the negative developer is substantially uniform throughout the resist layer.

In a third aspect of the disclosure, a double patterning method includes: forming a resist layer by coating a substrate with a resist composition; exposing the resist layer to a first radiant energy density of UV rays; forming a first pattern in the resist layer by developing the resist layer with a positive developer; exposing the resist layer to a second radiant energy density of UV rays; and forming a second pattern in the resist layer by developing the resist layer with a negative developer, the second pattern including one or more features of the first pattern; wherein the forming of the first and second patterns in the resist layer creates at least two resist coating features.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure.

Figure 1:
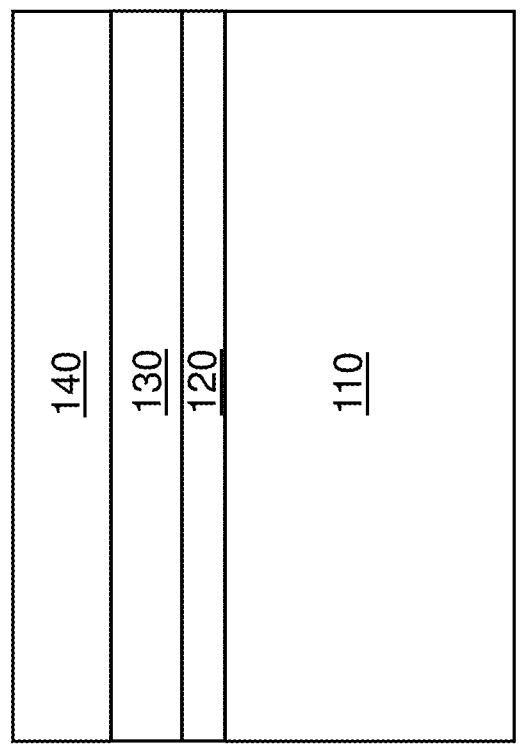
FIG. 1 is a cross section view of a structure of the disclosure illustrating forming a resist layer on a substrate.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. The subject matter of this disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

In the interest of not obscuring the presentation of embodiments of the present disclosure, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present disclosure.

The present disclosure relates generally to double patterning methods for use in the process of producing a semiconductor device such as an integrated circuit (IC) and more particularly, to litho-litho-etch (LLE) double patterning methods. As mentioned above, typical double patterning methods such as LELE are expensive due to double the number of process steps in the lithography flow and other methods such as SADP and SAQP have limited design flexibility. Methods of double patterning wherein the lithography flow is simplified and faster, and thus less expensive, are described below and with reference to the Figures.

FIG. 1 illustrates forming a sole resist layer 140 on a substrate 110 (optional layers 120 and 130 there between being possible and discussed below). As used herein, "sole resist layer" refers to a single and only resist layer having a uniform distribution of a resist composition. In other words, "sole resist layer" does not refer to an assembly of multiple layers. Resist layer 140 is formed by coating substrate 110 (or the topmost layer of optional layers 120 and 130) with a resist composition. The resist composition can be any now known or later developed photoresist composition that satisfies the following: (a) solubility in a positive tone development (PTD) developer that increases upon irradiation with UV rays of a first radiant energy density, and (b) solubility in a negative tone development (NTD) developer that decreases upon irradiation with UV rays of a second radiant energy density, wherein (c) the second radiant energy density of UV rays is greater than the first radiant energy density of UV rays.

As used herein, "radiant energy density" refers to radiant energy per volume, typically expressed in millijoules per square centimeter (mJ/cm$^2$). Radiant energy density is related to irradiance (intensity) in that radiant energy density includes time with the irradiance measurement. In other words, radiant energy density is the area under an irradiance curve when plotted against time. The first radiant energy density of UV rays may be within a range from approximately 0.1 to approximately 100 mJ/cm$^2$. The second radiant energy density of UV rays may also be within a range from approximately 0.1 to approximately 100 mJ/cm$^2$. However, it is noted that the second radiant energy density of UV rays should be greater than the first radiant energy density of UV rays. The second radiant energy density may be approximately 5 to approximately 50 mJ/cm$^2$ greater than the first radiant energy density. Preferably, the second radiant energy density of UV rays is approximately two times (double) the first radiant energy density of UV rays.

PTD developers can be any now known or later developed PTD organic solvents, inorganic solvents, metal ion free solvents and metal ion containing solvents. PTD developers may include, but are not limited to, tetramethyl ammonium hydroxide (TMAH), potassium hydroxide (KOH) and sodium hydroxide (NaOH).

NTD developers can be any now known or later developed NTD organic aromatic solvents. NTD developers may include, but are not limited to, benzene, toluene and xylene.

Resist (photoresist) compositions are well known in the lithography industry. Resist compositions can include any now known or later developed photoresist compositions including, but not limited to, photopolymeric photoresist compositions, photodecomposable photoresist compositions and photocrosslinking photoresist compositions. A photopolymeric photoresist is a type of photoresist which can generate free radicals when exposed to light, then initiates the photopolymerization of monomer(s) to produce a polymer. Photopolymeric photoresists are typically used for negative photoresists, e.g. methyl methacrylate. A photodecomposing photoresist is a type of photoresist that generates hydrophilic products under light. Photodecomposing photoresists are typically used for positive photoresists, e.g. azide quinone. A photocrosslinking photoresist is a type of photoresist which generates an insoluble network when exposed to light, for example by crosslinking chain by chain. Photocrosslinking photoresists are typically used for negative photoresists.

For purposes of this disclosure, the resist composition can be any photopolymeric, photodecomposable, photocrosslinking or any other type of photoresist composition so long as the photoresist composition satisfies the above noted: (a) solubility in a positive tone development (PTD) developer that increases upon irradiation with UV rays of a first radiant energy density, and (b) solubility in a negative tone development (NTD) developer that decreases upon irradiation with UV rays of a second radiant energy density, wherein (c) the second radiant energy density of UV rays is greater than the first radiant energy density of UV rays. A non-limiting example of a polymer formulation that can be used as the resist composition is ECPMA/aGBLMA (50/50) ($M_w$=7300 g/mol) ($M_w/M_n$=1.35):

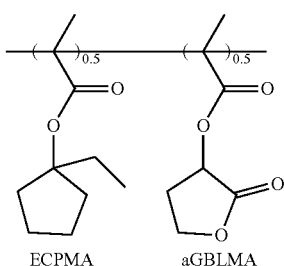 [SMILES: CCC1(OC(=O)C(C)(C)CCC(C)(C)C(=O)OC2CCOC2=O)CCCC1]

ECPMA    aGBLMA wherein its corresponding photoacid generator (PAG) can be triphenylsulfonium perfluorobutane sulfonate (TPS-PFBuS) (2, 5 or 8% of solids) and corresponding quencher can be trioctylamine (10, 20 or 30% of the PAG loading).

Regarding the intervening layers that may be present between substrate 110 and resist layer 140, it is noted that such intervening layer may be, for example, any one or more of a bottom anti-reflective coating (BARC) and a hardmask (HM). An optional BARC layer 130 and an optional HM layer 120 are depicted in FIG. 1. BARC layer 130 can be composed of any bottom anti-reflective coating that absorbs light and uses destructive interference to give little reflection at the resist/anti-reflective coating interface. HM layer 120 can be composed of any organic and inorganic hardmask materials. Examples of organic type hardmasks include amorphous carbon and organo-siloxane based materials with reflection control properties; these organic hardmasks can be deposited either by a chemical vapor deposition (CVD) process or a spin-on process. Examples of inorganic type hardmasks include silicon nitride (SiN), silicon oxy-nitride (SiON) and titanium nitride (TiN); these inorganic hardmasks are typically deposited by a CVD process. Regardless of whether or not the hardmask is organic or inorganic, the hardmask needs to have etch resistance to either oxygen rich plasma or halogen rich plasma (depending on the substance to be etched away).

Substrate 110, on which resist layer 140 or intervening layers 120 or 130 may be formed, can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Figure 2:
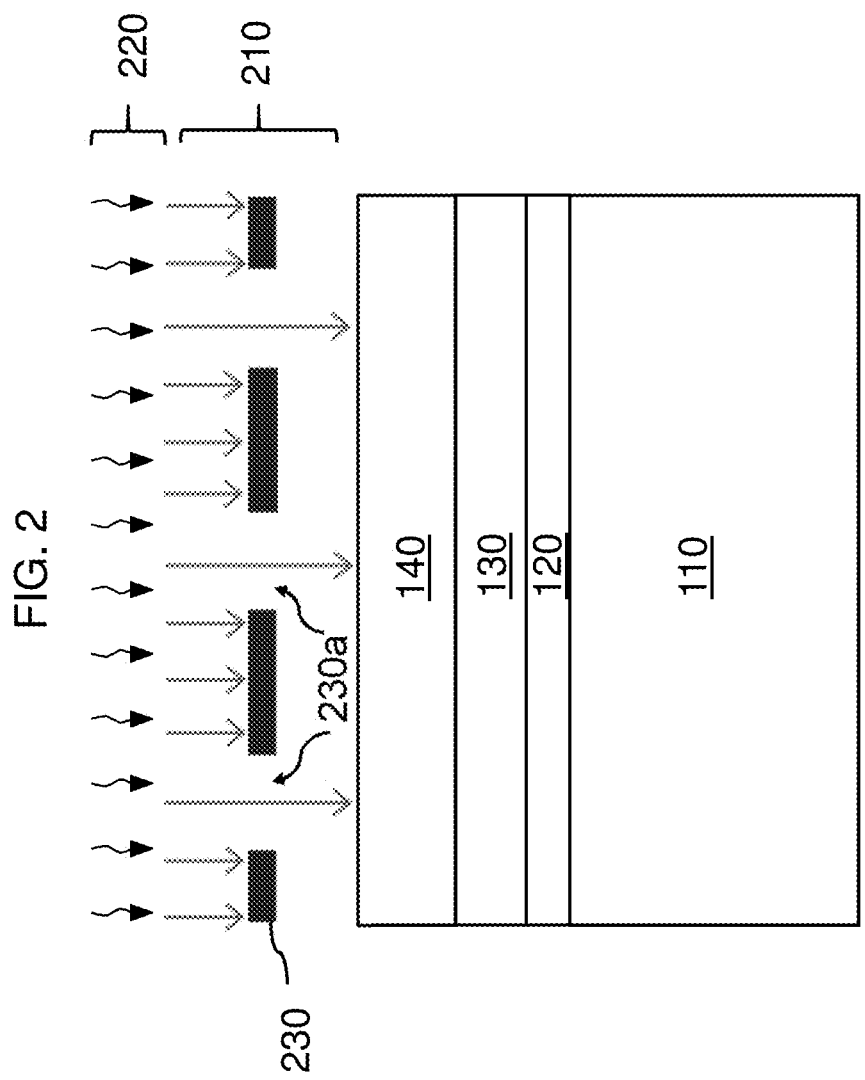
FIG. 2 is a cross-section view of the structure illustrating ultraviolet (UV) ray exposure through first openings of a hardmask, followed by heating.

Now turning to FIG. 2, this figure illustrates exposing resist layer 140 to a first radiant energy density of UV rays 210 (see straight arrows). This exposure of UV rays 210 is performed through at least one first opening 230a in a first hardmask 230. Three openings 230a are shown in FIG. 2, however any number of openings 230a may be present in first hardmask 230. Openings 230a shown in FIG. 2 are similar in size/shape, however any size/shape may be utilized and openings 230a may be the same size/shape or different sizes/shapes. Openings 230a determine a first pattern 310 in resist layer 140 (see FIG. 3). First hardmask 230 may be composed of any suitable hardmask material including, but not limited to, any insulative or masking material that can protect resist layer 140 and/or other underlying materials during UV ray exposure, for example, an insulator composed of a nitride material (e.g., a silicon nitride) or an oxide material (e.g., a silicon oxide).

FIG. 2 also depicts optional heating of resist layer 140 (see curvy arrows 220). This optional heating is performed after the exposure of resist layer 140 to the first radiant energy density of UV rays 210 but before developing of resist layer 140 with the positive developer (discussed later). The heating is typically referred to as "baking" or "post exposure bake (PEB)" in the lithography industry.

Figure 3:
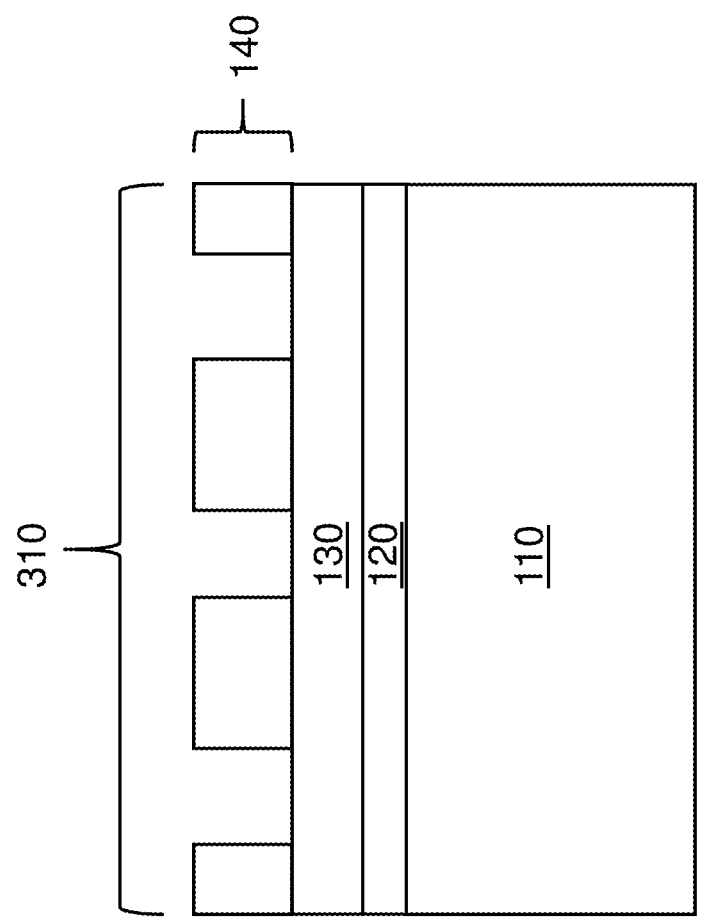
FIG. 3 is a cross-section view of the structure illustrating a first pattern formed in the resist layer by positive tone development.

FIG. 3 illustrates formation of the first pattern 310 in resist layer 140. As noted above, first pattern 310 is determined by openings 230a in first hardmask 230 (see FIG. 2). The forming of first pattern 310 is effected by developing resist layer 140 with a PTD developer (discussed above) in a positive tone development process. In positive tone development, a resist is exposed with UV light where the underlying material is to be removed. Exposure to the UV light changes the chemical structure of the resist so that it becomes more soluble in the developer. The exposed resist is then washed away by the developer solution, leaving areas of bare underlying material. A mask in PTD, therefore, contains an exact copy of the pattern which is to remain.

Figure 4:
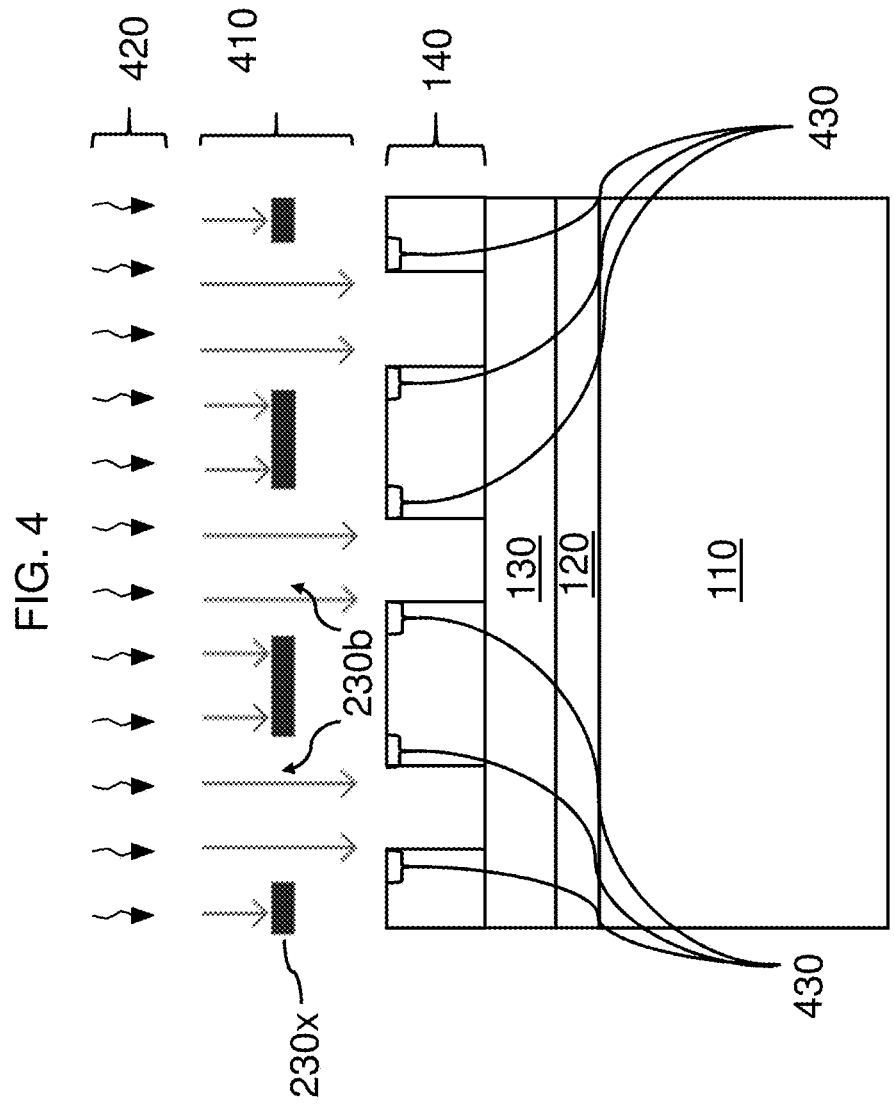
FIG. 4 is a cross-section view of the structure illustrating UV ray exposure through second openings of the hardmask, followed by heating.

FIG. 4 illustrates exposing resist layer 140 to a second radiant energy density of UV rays 410 (see straight arrows). This exposure of UV rays 410 is performed through at least one second opening 230b in a second hardmask 230x. Second hardmask 230x can be an entirely different hardmask as compared to first hardmask 230 or second hardmask 230x can be a modified version of first hardmask 230. If second hardmask 230x is a modified version of first hardmask 230, second hardmask 230x is created by widening the first opening(s) 230a of first hardmask 230 and thereby creating second opening(s) 230b. Said widening can be symmetric or asymmetric. Regardless of the nature of second hardmask 230x (modified first hardmask or entirely different hardmask), second opening(s) 230b encompass and are larger than first opening(s) 230a. As used herein, "encompass" means to surround and have within. Thus, second opening(s) 230b surround and contain within them the first opening(s) 230a. Second opening(s) 230b expose at least one portion 430 of resist layer 140 not exposed to the first radiant energy density of UV rays by first opening(s) 230a. Three second openings 230b are shown in FIG. 4, however any number of second openings 230b may be present in hardmask 230x. Openings 230b shown in FIG. 4 are similar in size/shape, however any size/shape may be utilized and openings 230b may be the same size/shape or different sizes/shapes. The portion(s) 430 of resist layer 140 exposed to the second radiant energy density of UV rays 410 determine a second pattern 510 in resist layer 140 (see FIG. 5).

FIG. 4 also depicts optional heating of resist layer 140 (see curvy arrows 420). This optional heating is performed after the exposure of resist layer 140 to the second radiant energy density of UV rays 410 but before developing of resist layer 140 with the negative developer (discussed later). Again, this heating is typically referred to as "baking" or "post exposure bake (PEB)" in the lithography industry.

Figure 5:
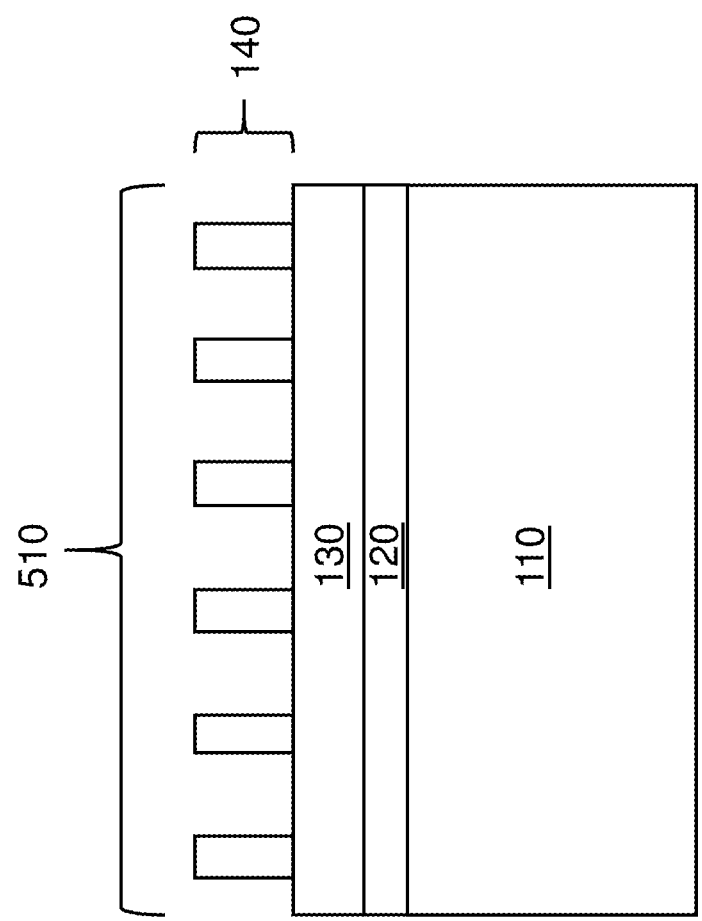
FIG. 5 is a cross-section view of the structure illustrating a second pattern formed in the resist layer by negative tone development.

FIG. 5 illustrates formation of the second pattern 510 in resist layer 140. As noted above, second pattern 510 is determined by portion(s) 430 of resist layer 140 exposed to the second radiant energy density of UV rays 410 (see FIG. 4). It is noted that second pattern 510 is not independent from first pattern 310; rather, second pattern 510 is based on first pattern 310, or in other words, second pattern 510 includes one or more features of first pattern 310. The forming of second pattern 510 is effected by developing resist layer 140 with a NTD developer (discussed above) in a negative tone development process. In negative tone development, when a resist is exposed to UV light, the resist becomes crosslinked/polymerized and more difficult to dissolve in developer; therefore, the resist remains where it is exposed and the developer solution removes the unexposed areas. A mask in NTD, therefore, contains the inverse or photographic "negative" of the pattern to be transferred.

The above described double patterning method therefore includes 1 resist coating step, 2 exposure steps and 2 development steps. This differs from known techniques including 2 coatings, 2 exposures and 2 developments. One benefit of the disclosed double patterning method including 1 coating, 2 exposures and 2 developments, is the sole resist layer formation which eliminates a resist coating step from the process steps in the lithography flow. This elimination of a lithography flow process step results in a simplified, faster and less expensive process.

The double patterning method of the disclosure which includes 1 resist coating step, 2 exposure steps and 2 development steps also differs from known techniques including 1 coating, 1 exposure and 2 development steps. Such known techniques including 1 coating, 1 exposure and 2 development steps suffer from an acid concentration gradient in the resist layer after the completion of 1 exposure followed by 2 development steps.

Figure 6:
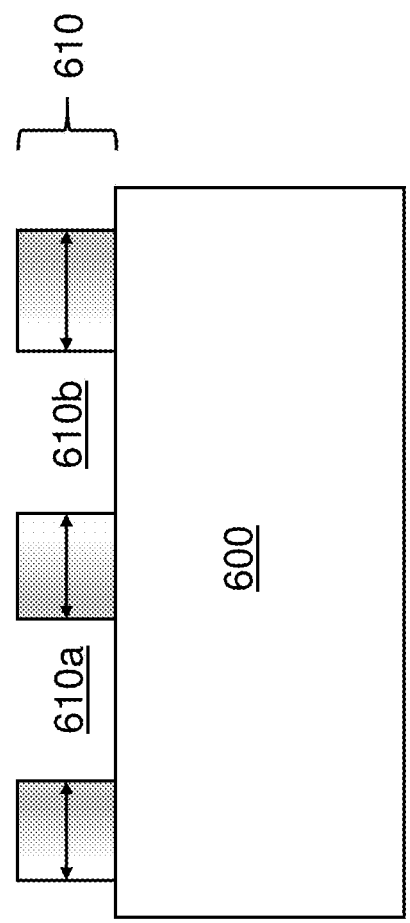
FIG. 6 is a depiction of a prior art structure illustrating an acid concentration gradient within a resultant resist layer.

FIG. 6 illustrates the result of the known 1 coating, 1 exposure and 2 development techniques. A resist layer 610 (after completion of 1 exposure followed by 2 development steps) on a substrate 600 is shown, the resist layer 610 portions remaining having an acid concentration gradient therein (see arrows; see also gradient shading from white to dark grey). The acid concentration gradient results in areas 610a and 610b having different capillary forces and different etch resistances. For instance, in the case where area 610a is a recess created by NTD and area 610b is a recess created by PTD, the acid concentration surrounding area 610a is low creating a more protected, hydrophobic, higher etch resistance area as compared to area 610b with a high acid concentration surrounding the area and creating a less protected, hydrophilic, lower etch resistance area.

In contrast to the above noted problems resulting from an acid concentration gradient, in the double patterning methods of the disclosure which include 1 coating, 2 exposures and 2 development steps, a concentration of the acid remaining in the resist layer, after the developing of the resist layer with the negative developer (after the second development) is substantially uniform throughout the resulting resist layer. It is noted that there is acid remaining in the resist layer after the second development since the exposure of the resist layer to the first radiant energy density of UV rays generates an acid in an area substantially equal to an area of the resist layer exposed to the first radiant energy density of UV rays. In other words, some acid is present in the resist layer just beyond (outside) the area of the resist layer exposed to the first radiant energy density of UV rays. It is also noted that the positive developer washes away acidified portions of the resist layer where the acid concentration is above a particular threshold for the positive developer to function properly. Thus, not all of the acid generated in the resist layer is washed away during the PTD process, further contributing to the noted acid remaining in the resist layer after the second development.

"Substantially uniform" in the context of the acid concentration refers to the situation where there is no statistical net flux of acid molecules from one region of the resulting resist layer to another region of the resulting resist layer. The improved acid distribution as attained by the methods of the disclosure result in lessening of the problems associated with differing capillary forces and differing etch resistances because the substantially uniform acid concentration allows for similar capillary forces and similar etch resistances when comparing the areas surrounding NTD and PTD recesses.

Another benefit of the double patterning methods of the disclosure which includes 1 resist coating step, 2 exposure steps and 2 development steps as compared to the known techniques including 1 coating, 1 exposure and 2 development steps, is more design flexibility. The known techniques of 1 coating, 1 exposure and 1 development step are limited to unidirectional resist coating features. In other words, the known techniques produce only one-direction lines. In contrast, the double patterning methods of the disclosure have the design flexibility to produce unidirectional resist coating features (see FIG. 7) and multidirectional resist coating features (see FIG. 8).

Figure 7:
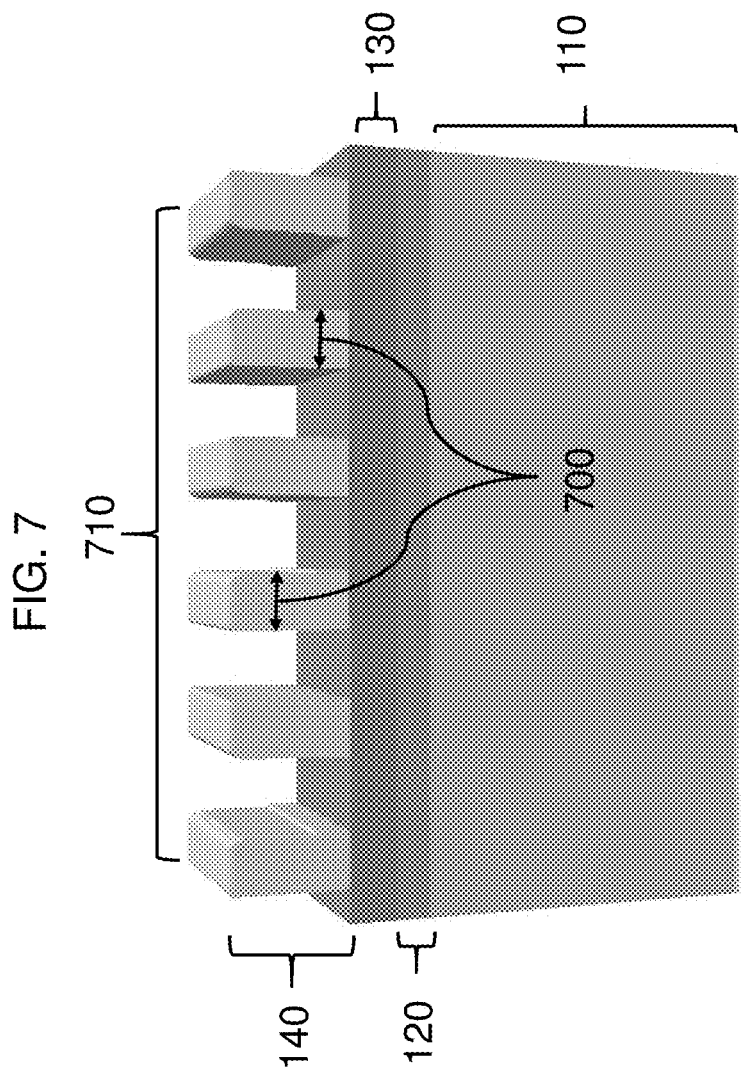
FIG. 7 is a three-dimensional view of a structure of the disclosure illustrating resist coating features formed by a process of the disclosure, the features being unidirectional.
Figure 8:
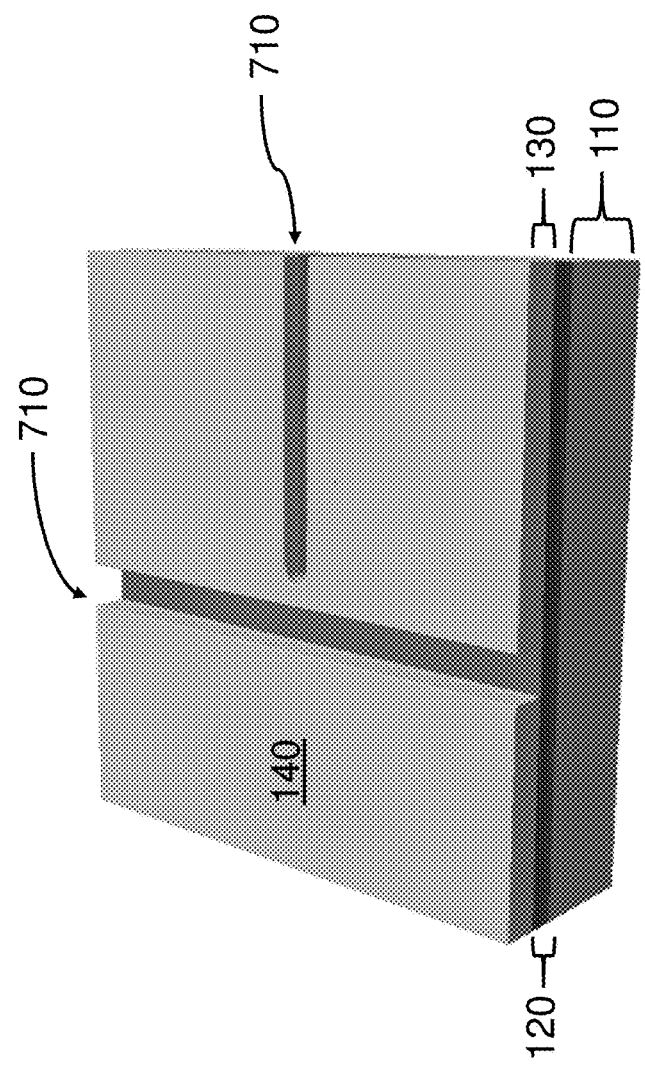
FIG. 8 is a three-dimensional view of a structure of the disclosure illustrating resist coating features formed by a process of the disclosure, the features being multidirectional, specifically orthogonal to one another.

As depicted in FIG. 7, the noted design flexibility of the double patterning methods of the disclosure further includes the ability to have a critical dimension 700 of resulting resist layer features 710 of less than 28 nanometers (nm). In the case of FIG. 8, multidirectional features 710 are orthogonal to one another (i.e., 90° angle); however, features 710 may be at any angle with one another and multiple features 710 may have the same or differing angles amongst the features.

In addition to the above-discussed design flexibility and critical dimension capability, the double patterning methods of the disclosure provide an additional benefit in that a resist layer thickness loss of only about 20% from prior to the two developments to after completion of the two developments is possible.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially uniform" as applied to acid concentration is defined above.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A double patterning method comprising:
    forming a sole resist layer by coating a substrate with a resist composition wherein solubility of the resist composition in a positive developer increases upon irradiation with ultraviolet (UV) rays of a first radiant energy density and solubility of the resist composition in a negative developer decreases upon irradiation with UV rays of a second radiant energy density, the second radiant energy density of UV rays being greater than the first radiant energy density of UV rays;
    exposing the resist layer to the first radiant energy density of UV rays through at least one first opening in a first hardmask;
    forming a first pattern in the resist layer by developing the resist layer with the positive developer, the at least one first opening in the first hardmask creating the first pattern;
    exposing the resist layer to the second radiant energy density of UV rays through at least one second opening in a second hardmask, the at least one second opening encompassing and being larger than the at least one first opening in the first hardmask, the at least one second opening in the second hardmask exposing at least one portion of the resist layer not exposed to the first radiant energy density of UV rays by the at least one first opening in the first hardmask; and
    forming a second pattern in the resist layer by developing the resist layer with the negative developer, the at least one portion of the resist layer exposed to the second radiant energy density of UV rays creating the second pattern, the second pattern including one or more features of the first pattern.

2. The method of claim 1, further comprising at least one of:
    heating the resist layer after the exposing of the resist layer to the first radiant energy density of UV rays but before the developing of the resist layer with the positive developer; and
    heating the resist layer after the exposing of the resist layer to the second radiant energy density of UV rays but before the developing of the resist layer with the negative developer.

3. The method of claim 1, wherein the first hardmask is modified such that the at least one first opening in the first hardmask is widened to create the second hardmask containing the at least one second opening.

4. The method of claim 1, wherein the first radiant energy density of UV rays and the second radiant energy density of UV rays are within a range of from approximately 0.1 to approximately 100 millijoules per square centimeter (mJ/cm$^2$), and the second radiant energy density is approximately 5 to approximately 50 mJ/cm$^2$ greater than the first radiant energy density.

5. The method of claim 4, wherein the second radiant energy density of UV rays is approximately two times the first radiant energy density of UV rays.

6. A double patterning method comprising:
    forming a resist layer by coating a substrate with a resist composition wherein solubility of the resist composition in a positive developer increases upon irradiation with ultraviolet (UV) rays of a first radiant energy density and solubility of the resist composition in a negative developer decreases upon irradiation with UV rays of a second radiant energy density, the second radiant energy density of UV rays being greater than the first radiant energy density of UV rays;
    exposing the resist layer to the first radiant energy density of UV rays through at least one first opening in a first hardmask;
    forming a first pattern in the resist layer by developing the resist layer with the positive developer, the at least one first opening in the first hardmask creating the first pattern;
    exposing the resist layer to the second radiant energy density of UV rays through at least one second opening in a second hardmask, the at least one second opening encompassing and being larger than the at least one first opening in the first hardmask, the at least one second opening in the second hardmask exposing at least one portion of the resist layer not exposed to the first radiant energy density of UV rays by the at least one first opening in the first hardmask; and
    forming a second pattern in the resist layer by developing the resist layer with the negative developer, the at least one portion of the resist layer exposed to the second radiant energy density of UV rays creating the second pattern, the second pattern including one or more features of the first pattern;
    wherein the exposing of the resist layer to the first radiant energy density of UV rays generates an acid in an area substantially equal to an area of the resist layer exposed to the first radiant energy density of UV rays, wherein a concentration of the acid remaining in the resist layer after the developing of the resist layer with the negative developer is substantially uniform throughout the resist layer.

7. The method of claim 6, further comprising at least one of:
    heating the resist layer after the exposing of the resist layer to the first radiant energy density of UV rays but before the developing of the resist layer with the positive developer; and
    heating the resist layer after the exposing of the resist layer to the second radiant energy density of UV rays but before the developing of the resist layer with the negative developer.

8. The method of claim 6, wherein the first hardmask is modified such that the at least one first opening in the first hardmask is widened to create the second hardmask containing the at least one second opening.

9. The method of claim 6, wherein the first radiant energy density of UV rays and the second radiant energy density of UV rays are within a range of from approximately 0.1 to approximately 100 millijoules per square centimeter (mJ/cm$^2$), and the second radiant energy density is approximately 5 to approximately 50 mJ/cm$^2$ greater than the first radiant energy density.

10. The method of claim 9, wherein the second radiant energy density of UV rays is approximately two times the first radiant energy density of UV rays.

11. A double patterning method comprising:
   forming a resist layer by coating a substrate with a resist composition;
   exposing the resist layer to a first radiant energy density of ultraviolet (UV) rays through at least one first opening in a first hardmask;
   forming a first pattern in the resist layer by developing the resist layer with a positive developer, the at least one first opening in the first hardmask creating the first pattern;
   exposing the resist layer to a second radiant energy density of UV rays through at least one second opening in a second hardmask, the at least one second opening encompassing and being larger than the at least one first opening in the first hardmask, the at least one second opening in the second hardmask exposing at least one portion of the resist layer not exposed to the first radiant energy density of UV rays by the at least one first opening in the first hardmask; and
   forming a second pattern in the resist layer by developing the resist layer with a negative developer, the at least one portion of the resist layer exposed to the second radiant energy density of UV rays creating the second pattern, the second pattern including one or more features of the first pattern;
   wherein the forming of the first and second patterns in the resist layer creates at least two resist coating features.

12. The method of claim 11, wherein solubility of the resist composition in the positive developer increases upon irradiation with the first radiant energy density of UV rays and solubility of the resist composition in the negative developer decreases upon irradiation with the second radiant energy density of UV rays, the second radiant energy density of UV rays being greater than the first radiant energy density of UV rays.

13. The method of claim 11, wherein the at least two resist coating features are multidirectional.

14. The method of claim 13, wherein at least two of the at least two resist coating features are orthogonal to one another.

15. The method of claim 11, further comprising at least one of:
   heating the resist layer after the exposing of the resist layer to the first radiant energy density of UV rays but before the developing of the resist layer with the positive developer; and
   heating the resist layer after the exposing of the resist layer to the second radiant energy density of UV rays but before the developing of the resist layer with the negative developer.

16. The method of claim 11, wherein the first hardmask is modified such that the at least one first opening in the first hardmask is widened to create the second hardmask containing the at least one second opening.

17. The method of claim 11, wherein the first radiant energy density of UV rays and the second radiant energy density of UV rays are within a range of from approximately 0.1 to approximately 100 millijoules per square centimeter (mJ/cm$^2$), and the second radiant energy density is approximately 5 to approximately 50 mJ/cm$^2$ greater than the first radiant energy density.

* * * * *